United States Patent
Cook et al.

(10) Patent No.: US 10,801,985 B2
(45) Date of Patent: Oct. 13, 2020

(54) SENSING CAPACITOR WITH A PERMEABLE ELECTRODE

(71) Applicant: Texas Instruments Incorporated, Dallas, TX (US)

(72) Inventors: Benjamin Stassen Cook, Addison, TX (US); Mehmet Aslan, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 508 days.

(21) Appl. No.: 15/173,468

(22) Filed: Jun. 3, 2016

(65) Prior Publication Data
US 2017/0350846 A1    Dec. 7, 2017

(51) Int. Cl.
| | |
|---|---|
| *G01N 27/22* | (2006.01) |
| *B82Y 30/00* | (2011.01) |
| *G01N 31/22* | (2006.01) |
| *H01L 21/02* | (2006.01) |

(Continued)

(52) U.S. Cl.
CPC ............ *G01N 27/223* (2013.01); *B82Y 30/00* (2013.01); *G01N 27/226* (2013.01);
(Continued)

(58) Field of Classification Search
CPC .... G01N 27/22; G01N 27/223; G01N 27/226; G01N 27/228; G01N 31/222; B82Y 30/00; H01L 28/40; H01L 28/55; H01L 28/56; H01L 28/57; H01L 28/60; H01G 9/00; H01G 9/008; H01G 9/052; H01G 9/16; H01G 9/22; H01G 11/22; H01G 11/24; H01G 11/26

See application file for complete search history.

(56) References Cited

U.S. PATENT DOCUMENTS 4,017,820 A * 4/1977 Ross .................... G01N 27/121
                                                        338/325
9,164,052 B1   10/2015 Speer et al.
(Continued)

FOREIGN PATENT DOCUMENTS

| CN | 102405409 A | 4/2012 |
| CN | 103210029 A | 7/2013 |

(Continued)

OTHER PUBLICATIONS

Zhang, Jintao, and Chang Ming Li. "Nanoporous metals: fabrication strategies and advanced electrochemical applications in catalysis, sensing and energy systems." Chemical Society Reviews 41.21 (2012): 7016-7031.*

(Continued)

*Primary Examiner* — Robert J Eom
(74) *Attorney, Agent, or Firm* — Michael A. Davis, Jr.; Charles A. Brill; Frank D. Cimino

(57) ABSTRACT

An integrated circuit (IC) with an impedance sensor fabricated on a surface of the substrate is disclosed. The impedance sensor includes a bottom conductive plate formed on the substrate. A sensing membrane is formed on the bottom conductive plate. A top conductive plate is formed on the sensing membrane, in which the top conductive plate is a fusion of conductive nanoparticles having a random three dimensional porosity that is permeable to a reagent.

15 Claims, 10 Drawing Sheets

(51) Int. Cl.
*H01L 21/288* (2006.01)
*H01L 21/321* (2006.01)
*H01L 49/02* (2006.01)

(52) U.S. Cl.
CPC ......... *G01N 27/228* (2013.01); *G01N 31/222* (2013.01); *H01L 21/02288* (2013.01); *H01L 21/288* (2013.01); *H01L 21/321* (2013.01); *H01L 28/60* (2013.01)

(56) References Cited

U.S. PATENT DOCUMENTS

| | | | | |
|---|---|---|---|---|
| 2004/0008471 | A1* | 1/2004 | Davis | G01D 5/24 361/306.3 |
| 2008/0180883 | A1 | 7/2008 | Palusinski et al. | |
| 2014/0332407 | A1 | 11/2014 | Mai et al. | |

FOREIGN PATENT DOCUMENTS

| | | |
|---|---|---|
| CN | 104583763 A | 4/2015 |
| JP | 2007206040 A | 8/2007 |
| WO | 2008067337 A2 | 6/2008 |
| WO | 2013028691 A1 | 2/2013 |
| WO | 2014030129 A1 | 2/2014 |
| WO | 2015054195 A1 | 4/2015 |

OTHER PUBLICATIONS

Hamid Farahani, Rahman Wagiran, and Mord Nizar Hamidon, "Humidity Sensors Principle, Mechanism, and Fabrication Technologies: A Comprehensive Review", Sensors 2014, ISSN 1424-8220, Apr. 30, 2014, pp. 7881-7939.

Denes K. Roveti, "Humidity/Moisture, Choosing a Humidity Sensor: A Review of Three Technologies" Sensors Online, Jul. 1, 2001, available at http://www.sensorsmag.com/sensors/humidity-moisture/choosing-a-humidity-sensor-a-review-three-technologies-840, p. 1-6.

L.M. Robeson, "Polymer Membranes for Gas Separation", Current Opinion in Solid State and Materials Science, vol. 4, Issue 6, Dec. 1999, pp. 549-552.

"3D Printing", Wikipedia, available at http://en.wikipedia.org/w/index.php?title=3D_printing&oldid=624190184, Sep. 4, 2014, pp. 1-35.

Kyoung-Sik Moon et al, "Thermal Behavior of Silver Nanoparticles for Low-Interconnect Applications", Journal of Electronic Materials, vol. 34, No. 2, 2005, Received Jul. 22, 2004, accepted Aug. 31, 2004, pp. 168-175.

International Search Report for PCT/US2017/035966 dated Oct. 19, 2017.

Search Report for CN201780032372.4, Office Action dated May 13, 2020, 8 pages.

* cited by examiner

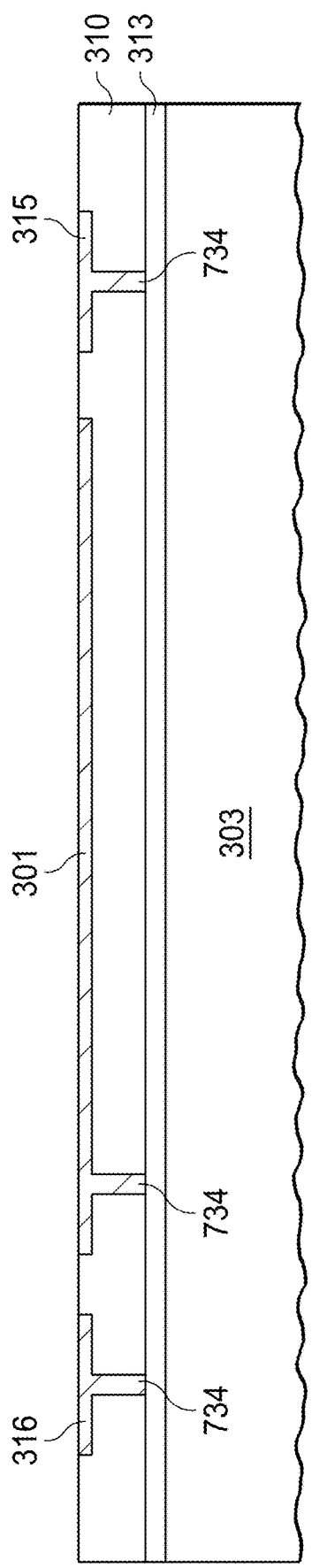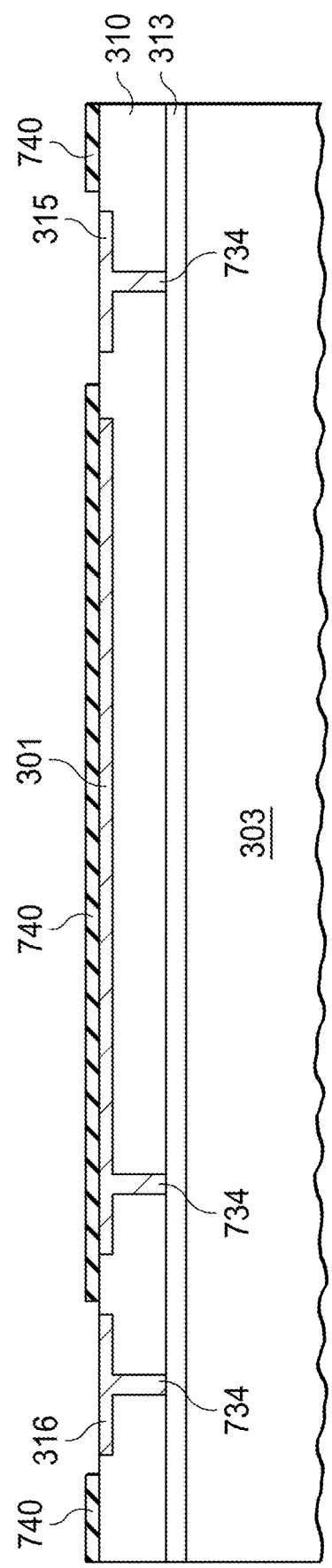

SENSING CAPACITOR WITH A PERMEABLE ELECTRODE

FIELD OF THE INVENTION

This disclosure relates to impedance sensor devices and in particular to a capacitive sensor with a permeable electrode.

BACKGROUND OF THE INVENTION

Capacitive relative humidity (RH) sensors are widely used in industrial, commercial, and weather telemetry applications. Capacitive integrated circuit (IC) based gas/humidity sensors are typically constructed with a planar interdigitated capacitor, which is then covered by a sensing film that varies in electrical permittivity based on reagent exposure. Changes in the electrical permittivity of the sensing film cause a change in the capacitance of the interdigitated capacitor as the fringing fields from the interdigitated capacitor pass through the sensing film.

While the term "insulator" implies low electrical conduction, "dielectric" is typically used to describe materials with a high polarizability; which is expressed by a number called the relative permittivity ($\varepsilon$). The term insulator is generally used to indicate electrical obstruction while the term dielectric is used to indicate the energy storing capacity of the material by means of polarization.

BRIEF DESCRIPTION OF THE DRAWINGS

Particular embodiments in accordance with the invention will now be described, by way of example only, and with reference to the accompanying drawings:

FIGS. 7A-7E illustrate a process for fabricating the parallel plate capacitive sensor of FIG. 3;

Figure 2:
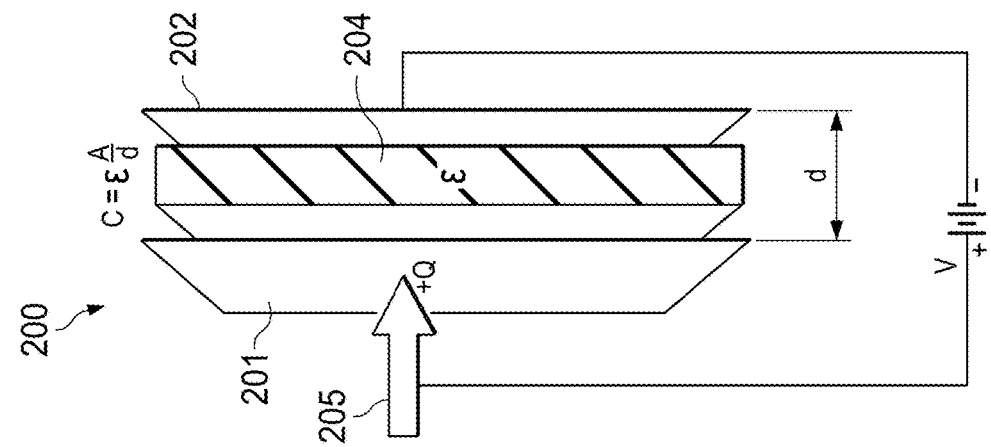
FIGS. 2-4 illustrate examples of an improved capacitive sensor.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 1A:
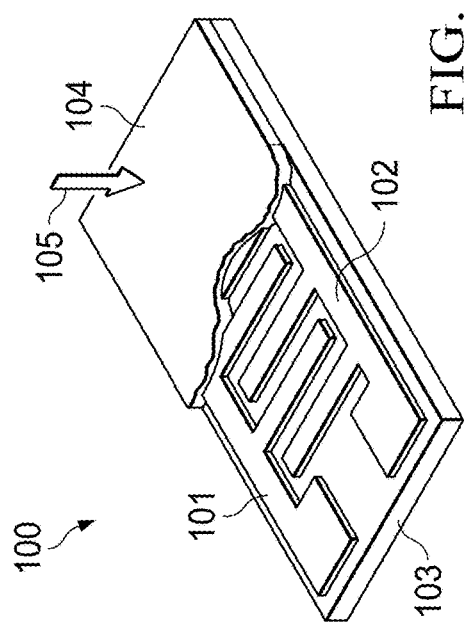
FIGS. 1A-1B illustrate a prior art capacitive sensor.
Figure 1B:
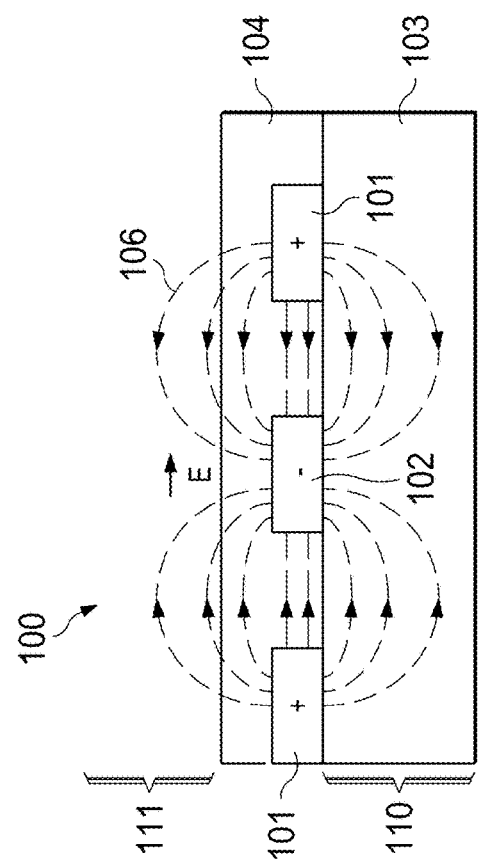

FIGS. 1A-1B illustrate a prior art capacitive gas/humidity sensor 100. Sensor 100 is constructed with a planar interdigitated capacitor in which interdigitated electrodes 101, 102 formed on a substrate 103. The substrate is typically glass, ceramic, or silicon, for example. Interdigitated electrodes 101, 102 are covered by a sensing film 104 that varies in electrical permittivity based on reagent exposure 105. Changes in the electrical permittivity or conductivity of the sensing film cause a change in the capacitance or resistance of interdigitated capacitor 100 as the fringing fields 106 from the interdigitated capacitor pass through sensing film 104.

Typically, sensing film 104 is selected such that the incremental change in the dielectric constant of capacitive humidity sensor 100 is nearly directly proportional to the relative humidity of the surrounding environment. However, other types of sensing film may be selected in which the electrical permittivity of the sensing film is sensitive to other types of reagent gases, for example.

Impedance sensors are typically characterized by low temperature coefficient, ability to function at high temperatures (up to 200° C.), full recovery from condensation, and reasonable resistance to chemical vapors. State-of-the-art techniques for producing capacitive sensors take advantage of many of the principles used in semiconductor manufacturing to yield sensors with minimal long-term drift and hysteresis. Thin film capacitive sensors may include monolithic signal conditioning circuitry integrated onto the substrate. A widely used signal conditioner incorporates a CMOS timer to pulse the sensor and to produce a near-linear voltage output.

However, a majority of the fields from an interdigitated capacitor do not pass through the sensing film as indicated at 110, 111. Therefore, the capacitance is a weak function of the sensing film permittivity, and the sensitivity ($dC/d\varepsilon_{sensing\_film}$) is limited. This means that the relative change in capacitance versus the total capacitance is quite small, and very hard to read.

FIG. 2 illustrates an improved impedance sensor configuration. While the following disclosure describes capacitive effects, other impedance sensor embodiments may be based on changes in resistivity or inductance in response to a reagent, for example. An optimal capacitive sensing topology is to have the sensing film 204 sandwiched between two electrodes 201, 202 similar to a parallel plate capacitor. In this configuration, nearly all of the fields from the parallel plate structure pass through sensing film 204; therefore the capacitance is a strong function of the permittivity, and thus a much higher sensitivity is achieved as indicated by expressions (1) and (2).

$$(dC \sim d\varepsilon_{sensing\_film}) \quad (1)$$

$$C \sim \varepsilon_{sensing\_film} * Area/thickness_{sensing\_film}. \quad (2)$$

In order for a parallel plate capacitor sensor to operate, one of the electrodes must be porous in order for the reagent gas to reach the sensing membrane. In this example, electrode 201 is porous to allow reagent gas 205 to easily pass through electrode 201 and thereby diffuse into sensing layer 204.

Fabricating an interdigitated sensor in a typical IC fabrication process is not extremely difficult because the interdigitated capacitive structure may be patterned in a top metal layer that may be part of a multilayer interconnect feature that is formed during the "back end of line" (BEOL). The sensing layer may be patterned after the BEOL is finished.

The back end of line (BEOL) is the second portion of IC fabrication where the individual devices (transistors, capacitors, resistors, etc.) get interconnected with wiring on the wafer, the metallization layer. Common metals are Copper interconnect and Aluminum interconnect. BEOL generally begins when the first layer of metal is deposited on the wafer. BEOL includes contacts, insulating layers (dielectrics), metal levels, and bonding sites for chip-to-package connections.

After the last "front end of line" (FEOL) step, there is a wafer with isolated transistors (without any wires). The FEOL is the first portion of IC fabrication where the individual devices (transistors, capacitors, resistors, etc.) are patterned in the semiconductor. FEOL generally covers everything up to (but not including) the deposition of metal interconnect layers.

In the BEOL fabrication stage, contacts (pads), interconnect wires, vias and dielectric structures are formed. For modern IC process, more than 10 metal layers may be added in the BEOL.

However, to pattern the parallel plate structure is much more difficult. A bottom electrode may be patterned in a top metal layer of the BEOL, and the sensing film may be patterned on top of the BEOL, but patterning another metal layer on top of the sensing layer is difficult because the sensing layer is not planarized and standard metal patterning methods (i.e. deposit, pattern resist, etch, strip resist) may not work. As explained above, the top electrode must be porous, so in addition to patterning an outline of the top electrode, an array of holes or other perforations must also be patterned in order for the metal electrode to be porous if it is fabricated from a deposited metal layer.

Figure 3:
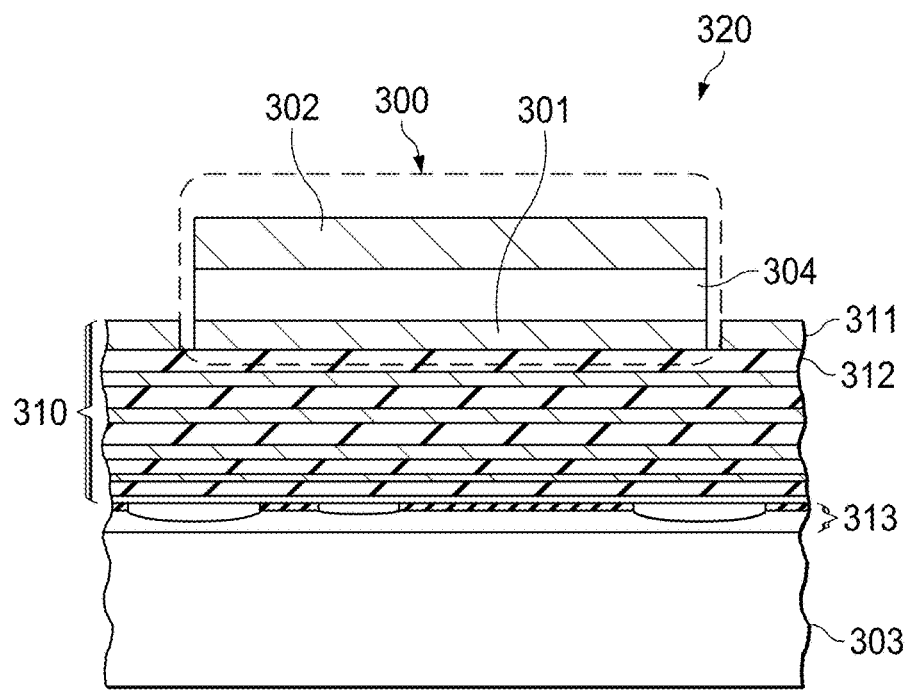

FIG. 3 is a cross sectional view of a portion of an example IC 320 in which a capacitive sensor 300 is formed on a top metal layer 311. In this example, an interconnect structure 310 includes five metal layers, such as metal layer 311, separated by insulation layers, such as insulation layer 312. The general BEOL fabrication process for forming a multilayer interconnect is well known and need not be described in detail herein. Other embodiments may have more or fewer conductive layers. Sensor 300 may be formed during the BEOL fabrication, or may be formed as a separate post-process, as described in more detail below.

In this example, bottom electrode 301 is patterned on the top metal layer 311. Sensing layer 304 is then patterned on top of bottom electrode 301. Top permeable electrode 302 is then formed on top of sensing layer 304 to form a parallel plate sensing capacitor 300.

Substrate 303 is silicon in the example, but other embodiments may use ceramic, glass, etc. as a substrate. In this example, an epitaxial (epi) silicon layer 313 may be formed on substrate 303. A thick epi layer may be beneficial for power semiconductors and MEMS-based sensors and actuators. "Thick" is a relative term, of course. Today, epi films of more than 20 µm are regarded as thick, although developmental targets for films can be as much as ~150 µm in thickness. The electrical isolating qualities of the undoped thick epi films may provide a benefit for power semiconductors. They enable higher voltages with larger R(off) values, and contribute to higher switching speeds and reduced device footprints. Various transistors may be formed in epi layer 313 using known fabrication techniques which need not be described herein.

Figure 4:
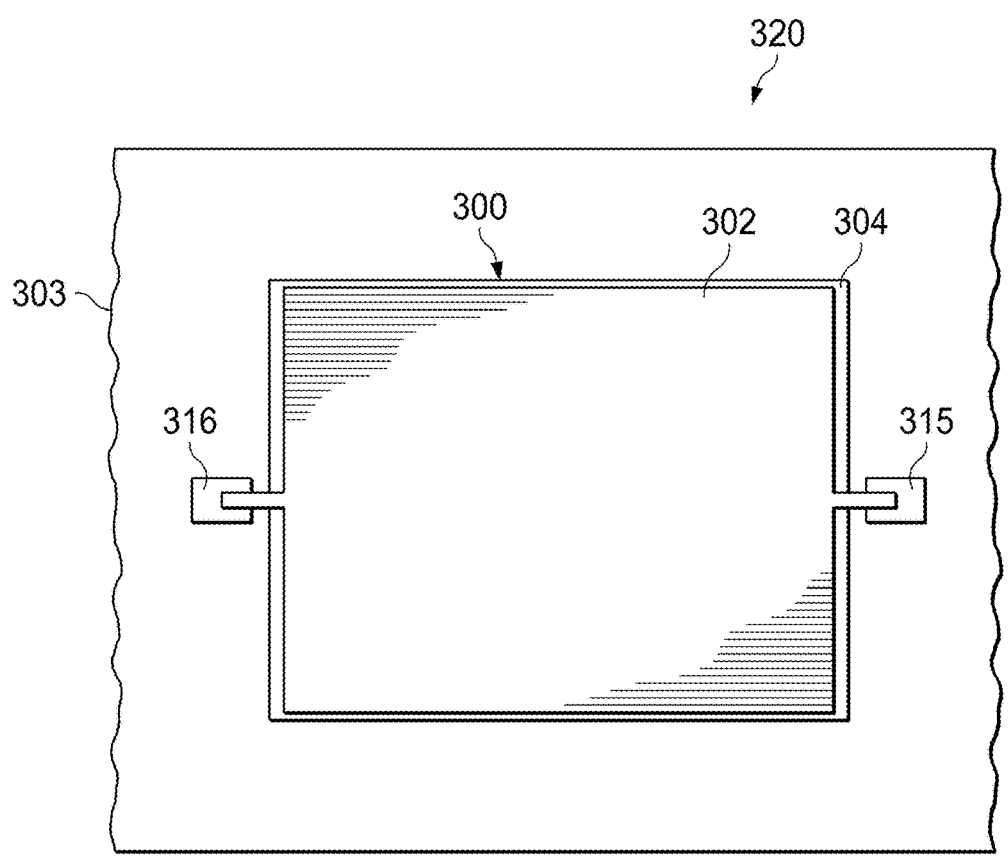

FIG. 4 is a top view of a portion of the example IC 320 as illustrated in FIG. 3 in which a capacitive sensor 300 is formed on a top metal layer 311 during the BEOL fabrication. On or more contacts 315, 316 may be provided to connect top permeable electrode 302 to other circuitry on IC 320. Permeable electrode 302 may be fabricated using a porous nanoparticle metal or permeable conductive polymer which allows a reagent to permeate the top electrode 302 and enter the sensing layer 304.

Figure 5A:
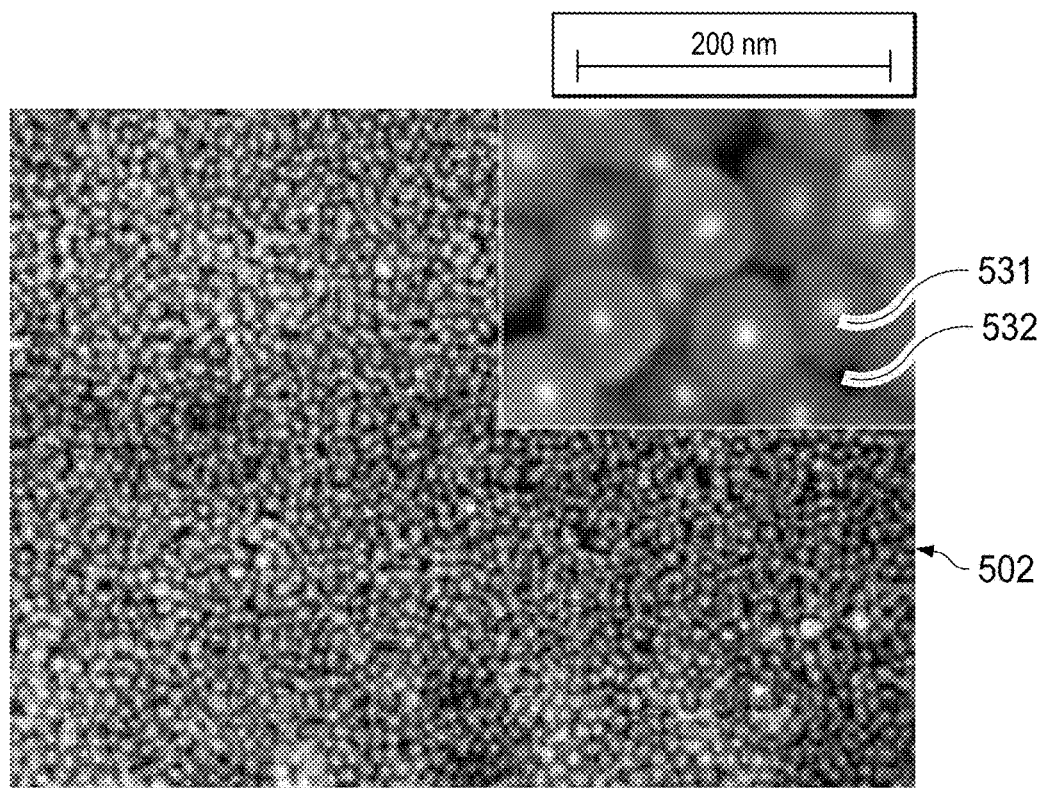
FIGS. 5A-5C illustrate a porous electrode having nanometer porosity.
Figure 5B:
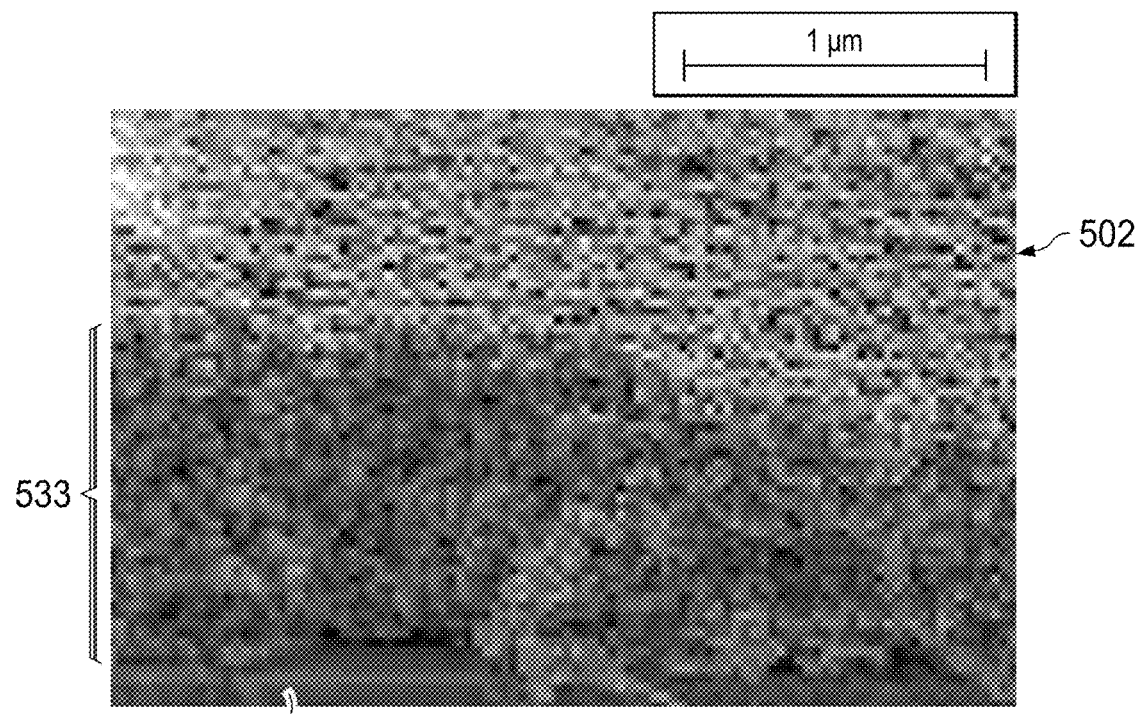

FIG. 5A is a top view and FIG. 5B is an edge view illustrating an example porous electrode 502 having random three dimensional (3D) porosity. Nanoparticles such as example nanoparticle 531 may be deposited in a layer and then fused together to form a 3D porous electrode structure. FIG. 5B illustrates an example of a randomly porous layer that has a thickness 533 of approximately 1 um that is formed on top of another layer 504, such as a sense layer 304, referring back to FIG. 3. Since the nanoparticles are roughly spherical, random voids may remain between the nanoparticles when they are fused together, such as the void indicated at 532.

Figure 5C:
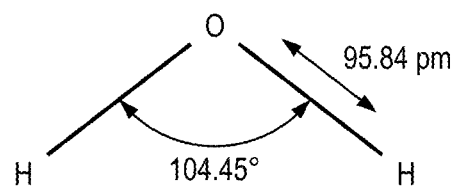

FIG. 5C is a schematic of a water molecule (H2O) for reference. Since an H2O molecule is less than approximately 200 pm across, it can easily pass through the nanometer scale pores left in porous electrode 502.

To solve the problem of fabricating the permeable top metal electrode on the parallel plate sensor, a two step solution may be used. First, the sensing film may be deposited on top of the last metal layer during or after BEOL by either standard lithographic methods, or by printing (inkjet, screen, etc. . . . ). Second, once the film is deposited, a deposition technology which can deposit porous metal over a topographic surface, such as inkjet printing, may be used to pattern the top electrode and connect the top electrode to pads on the IC.

As the gas/vapor needs to penetrate through the top electrode to absorb into the sensing film and change the film's permittivity, the top electrode may either be patterned in a grid fashion leaving a porous top electrode, or the top electrode may be printed with a permeable conductor such as metallic nanoparticles, or a permeable conductive polymer which allows the reagent to penetrate through the top electrode to enter/exit the sensing film.

This approach differs from prior art approaches in how the sensing capacitor is constructed. An interdigitated solution as shown in FIG. 1 has a low sensing capacitance to parasitic capacitance ratio, causing low signal to noise ratio (SNR) at the sensor and requires high resolution electronics to extract information. The interdigitated configuration also requires a large sensor area and higher power consumption. For a parallel plate sensor, the sensor area may be shrunk by up to two orders of magnitude. A parallel plate configuration as described herein may significantly improve the SNR at the sensor and simplify circuits needed for sensing the varying capacitance.

Fabrication of three dimensional structures using ink jet printers or similar printers that can "print" various polymer materials is well known and need not be described in further detail herein. For example, see "3D printing," Wikipedia, Sep. 4, 2014. Printing allows for the rapid and low-cost deposition of thick dielectric and metallic layers, such as 0.1 um-1000 um thick, for example, while also allowing for fine feature sizes, such as 20 um feature sizes, for example.

The ink may include a solvent or several solvents to match rheology and surface tension, and metallic nanoparticles. The size of the nanoparticle may be in a range of 2-100 nm, for example. The ink may also include a dispersant such as polyvinylpyrrolidone (PVP) or be charge dispersed to prevent agglomeration of the particles. The ink may also include binders such as polymer epoxies, and other known or later developed ink additives.

The film residue that is left from the ink may then be cured in the case of solvent or dispersant based ink where solvent or dispersant is evaporated. Curing may be thermal (50-250 C), UV, Infrared, Flash Lamp, or of another form that is compatible with the ink being used.

In this example, the metal nanoparticles may be silver or gold, or a mixture of copper and silver, for example. In another embodiment, the nanoparticles may be copper, a mixture of copper and graphene, or copper and graphite, for example. The graphite/grapheme mixtures allow for a higher current density without electromigration. In another embodiment, the nanoparticles may be copper oxide that is later reduced back to copper during a sintering step that will be described in more detail below. In another example, the conductive nanoparticles may be a non-metallic polymer, for example, or other types of known or later developed metallic or non-metallic conductive material.

The sintered metal layer is typically porous as a result of spaces that remain between the nanoparticles after the sintering process. The amount of porosity may be controlled by controlling one or more aspects of the sintering process, such as: selecting the size of the nanoparticles, selecting the temperature profile or other process parameters used to perform the sintering process, etc. See, for example, "Thermal Behavior of Silver Nanoparticles for Low-Temperature Interconnect Applications," KYOUNG-SIK MOON et al, 2005, which is incorporated by reference herein.

Another way to control porosity is to add a sacrificial nanoparticle to the ink, such as poly-methyl methacrylate, or other polymer, silica, etc; then remove these particles during the sintering or after the sintering to increase the porosity. A typical nanoparticle sintered metal electrode may have a porosity of approximately 20%. Generally, porosity may be selected to fall within a range of 10%-50% while still providing good current carrying capacity and structural integrity.

Sintering may be performed in a number of ways. For example, the parts may be heated to an elevated temperature but need not be heated to the melting point of the metal that forms the nanoparticles. For example, silver nanoparticles may be heated to a range of 80-300 C to form a solid structure. For comparison, the melting point of bulk silver is 961.8 C.

Figure 6:
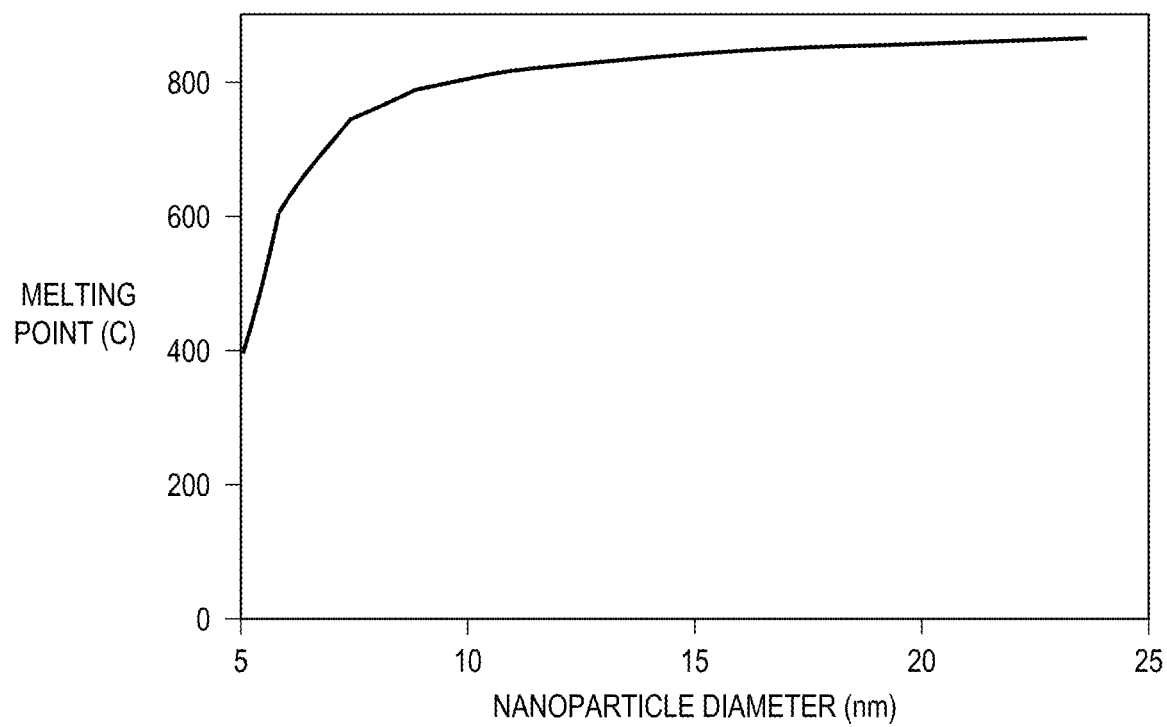
FIG. 6 is a plot illustrating melting point vs. particle size in a sintering process.

FIG. 6 is a plot illustrating melting point vs. particle size for silver nanoparticles in a sintering process; however, other types of nanoparticles follow a similar trend. The small nanoparticles may melt together at very low temperatures; however, as they melt together they get larger which causes the "bulk" melting temperature of the nanoparticles to go up. This causes an irreversible process in which higher temperature will only make the particles get bigger and thus melt at an even higher temperature. Thus, once the small nanoparticles are melted, the resulting structure cannot be un-melted like solder, unless the melting point of the bulk metal is reached. Note in FIG. 6, while sintering may occur at a temperature range of 80-300 C for silver nanoparticles, the resulting sintered metal layer cannot be re-melted unless the temperature of the sintered metal structure is raised to 961.8 C, which is the melting point of bulk silver.

In another embodiment, silver oxide nanoparticles, for example, may be sintered using a Xenon flash lamp using a known or later developed photon sintering process.

In another embodiment, silver oxide nanoparticles, for example, may be sintered in a reducing atmosphere using a known or later developed forming gas or formic acid sintering process. In this case, the copper oxide is converted back to pure copper by the formic acid process. Typically, this process may be performed at a temperature in the range of 200-250 C.

In another embodiment, various materials may be selected to get further "functionalization". For example, silver or gold nanoparticles have a different surface chemistry than titanium or copper nanoparticles and will bind to reagents differently to affect filtering.

Figure 7C:
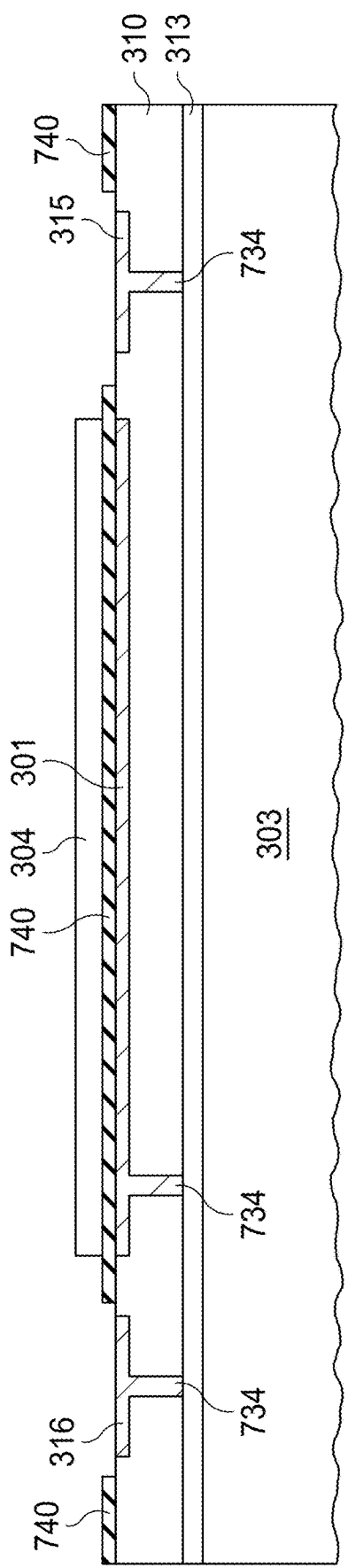

FIGS. 7A-7E are cross sectional views illustrating a process for fabricating parallel plate capacitive sensor 300, as described above. Referring now to FIG. 7A, as discussed above, substrate 303 may be silicon, ceramic, glass or other types of known or later developed semiconductor or insulating materials that may be used as a foundation for an integrated circuit. In this example, epi layer 313 is fabricated on top of substrate 303 and various transistors are then fabricated in epi layer 313 using a known or later developed FEOL fabrication process.

Multilayer interconnect 310 is then fabricated on substrate 303 using a known or later developed BEOL fabrication process. On the top metal layer of interconnect 310, a bottom electrode 301 may be patterned along with one or more contacts 315, 316 for the top electrode. Vias 734 in interconnect 310 may be provided to couple the contacts and bottom electrode 301 to circuitry located in epi layer 313. In this manner, a bottom conductive plate may be formed on the substrate, which includes bulk substrate 303 and any intervening layers that are built on top of bulk substrate 303.

FIG. 7B illustrates an optional deposition of a nitride scratch coat 740 after it has been patterned. The resulting silicon nitride layer may act as an insulator and chemical barrier for reagents that are later provided to the IC during sensor operation.

FIG. 7C illustrates fabrication of sensing element 304. Sensing element 304 may be formed using a known or later developed material whose permittivity is sensitive to a particular reagent that is a target for the sensor. For example, in a humidity sensor sensing element 304 must be sensitive to water vapor. Example materials may include polyenzoxazoles (PBO), Polyimide, Flourinated Polyimide, Graphene, Carbon Nanotubes, Pedot:PSS (poly(3,4-ethylenediozythiopene) polystyrene sulfonate), etc. In this example, the material used is PBO.

Sensing element 304 may be fabricated using inkjet printing, screen printing, or other known or later developed additive processes. Alternatively, sensing element 304 may be fabricated by depositing a layer of material over substrate 303 and then patterning and etching the layer to form the sensing element shape.

Figure 7D:
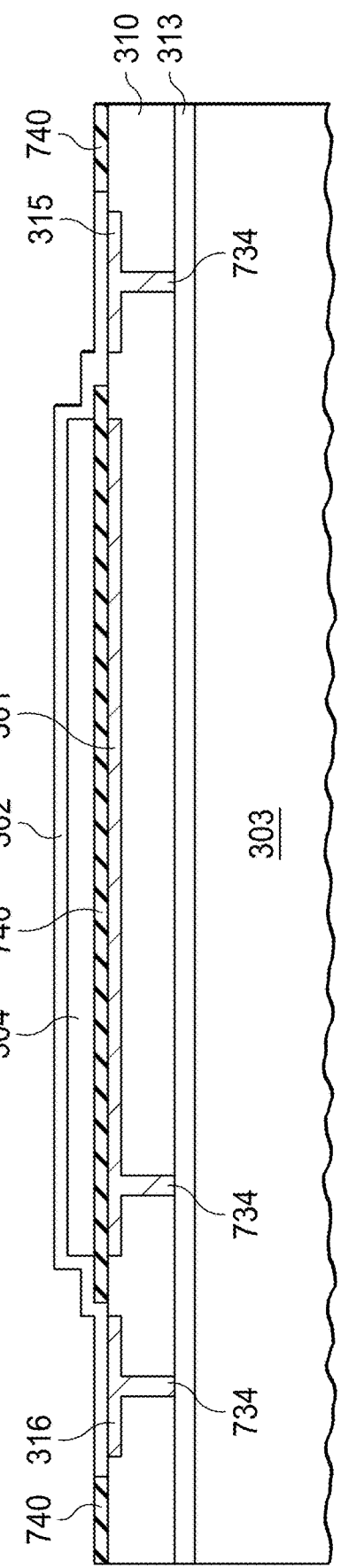

FIG. 7D illustrates formation of porous top electrode 302. As discussed above in more detail, porous top electrode 302 may be formed by inkjet printing an ink that contains metallic nanoparticles. Alternatively, a screen printing process may be used with an ink containing metallic nanoparticles or conductive polymer nanoparticles. Alternatively, top porous electrode 304 may be fabricated by depositing a layer of material containing nanoparticles over substrate 303 and then patterning and etching the layer to form the top electrode shape.

Once the material for the top electrode is in position, a sintering process may be performed as described above in more detail to fuse the nanoparticles into an electrically conductive capacitor plate. In this manner, a porous top conductive plate 302 may be formed on the sensing membrane in which the top conductive plate is a fusion of metallic nanoparticles having a random three dimensional porosity that is permeable to a reagent.

Figure 7E:
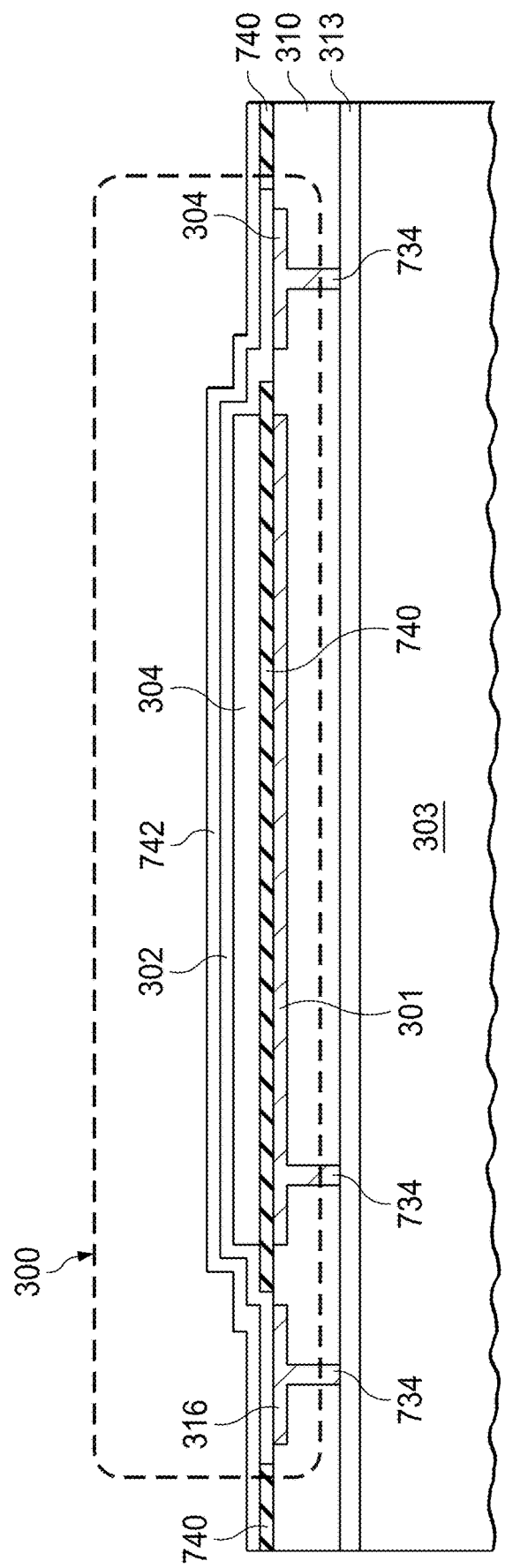

FIG. 7E illustrates an optional deposition of a permeable membrane 742 that may be applied over the surface of sensor 300 and beyond. Permeable membrane 742 may be selected from a family of polymers that are permeable to some gases and block other gases in order to provide a filter to selectively allow only certain gases to reach sensing element 304. Table 1 list several candidate polymers that may be used as a filter layer for various gases, as described in further detail in Robeson L. M. Current Opinion in Solid State & Materials Science, 4 (1999) pg 549.

TABLE 1

Candidate materials for filtering membrane

| | PERMEABILITY (Barrers) | | | | PERMSELECTIVITY (a) | | |
|---|---|---|---|---|---|---|---|
| | $O_2$ | $N_2$ | He | $CO_2$ | $CH_4$ | $O_2/N_2$ | $He/N_2$ | $CO_2/CH_4$ |
| PTMSP | 9710 | 6890 | 6750 | 37000 | 18400 | 1.41 | 0.98 | 2.01 |
| Poly(4-methyl-1-pentyne) | 2700 | 1330 | 2630 | 10700 | 2900 | 2.03 | 3.69 | 1.98 |
| Silicone Rubber | 781 | 351 | 590 | 4550 | 1430 | 2.22 | 1.68 | 3.18 |
| TMPA-6FDA Polyimide[a] | 122 | 35.6 | 440 | | 28.2 | 3.43 | | 15.6 |
| Poly(4-methyl-1-pentene) | 27.0 | 6.7 | 95.4 | 84.6 | 14.9 | 4.03 | 14.2 | 5.68 |
| PPO[b] | 14.6 | 3.5 | 82.3 | 65.5 | 4.1 | 4.17 | 23.5 | 16.0 |
| Tetrabromobisphenol A Polycarbonate | 1.36 | 0.182 | 17.6 | 4.23 | 0.126 | 7.47 | 96.7 | 33.6 |
| Polysulfone | 1.2 | .020 | 11.0 | 4.9 | 0.21 | 6.0 | 52.4 | 23.3 |

[a]TMDA52,3,5,6-tetramethyl phenylene diamine; 6FDA55,50-[1,1,1-trifluoromethyl)ethylidiene]bis-1,3 isobenzofurandione.
[b]PPO5poly(2,6-dimethyl-1,4-phenylene oxide); Temperature 258 C. for PTMSP and poly(4-methyl-1-pentyne) other polymers at 358 C.;
Data from cited references While a single filter layer 742 is illustrated in FIG. 7E, in another embodiment two or more filter layers may be provided. While filter layer 742 is illustrated on top of electrode 302, in another embodiment one or more filter layers may be postioned below top electrode 302 and on top of membrane 304.

Filter membrane 742 may be applied using various known or later developed processes, such as: atomic layer depostion (ALD), molecular beam epitaxy (MBE), evaporation, sputtering, etc.

Referring again to FIGS. 7C and/or 7D, sensing layer 304 and/or top electrode 302 may have a random 3D porosity that is formed by sacrificial nanoparticles. In this case, the following process may be used. When forming sensing layer and/or top electrode 302, an ink is used that contains solvent, dispersant, structural material (in polymer, nanoparticle, or other form), and sacrificial nanoparticles. The sacrificial nanoparticles may be a polymer such as: PMMA (polymethyl methacrylate), PVP (polyvinylpyrrolidone), etc; an oxide such as: $SiO_2$, SiN, ZnO, etc.

The applied ink may then be cured, polymerized, or sintered, depending on the type of ink.

The sacrificial nanoparticles may then be removed using temperature, solvent, dry vapor phase etch, etc; again depending on the type of sacrificial nanoparticle and the structural material. The removal procedure must prefer removal of the sacrificial material over the structural material so the structural material remains intact.

The final sensor and/or top electrode film is left with pores wherever the sacrificial nanoparticles were located. In this manner, a sensing membrane may be formed on the bottom conductive plate in which the sensing membrane is a fusion of nanoparticles having a random three dimensional porosity that is permeable to a reagent. Similarly, in this manner a top conductive plate may be formed on the sensing membrane, in which the top conductive plate is a fusion of metallic nanoparticles having a random three dimensional porosity that is permeable to a reagent.

Figure 8:
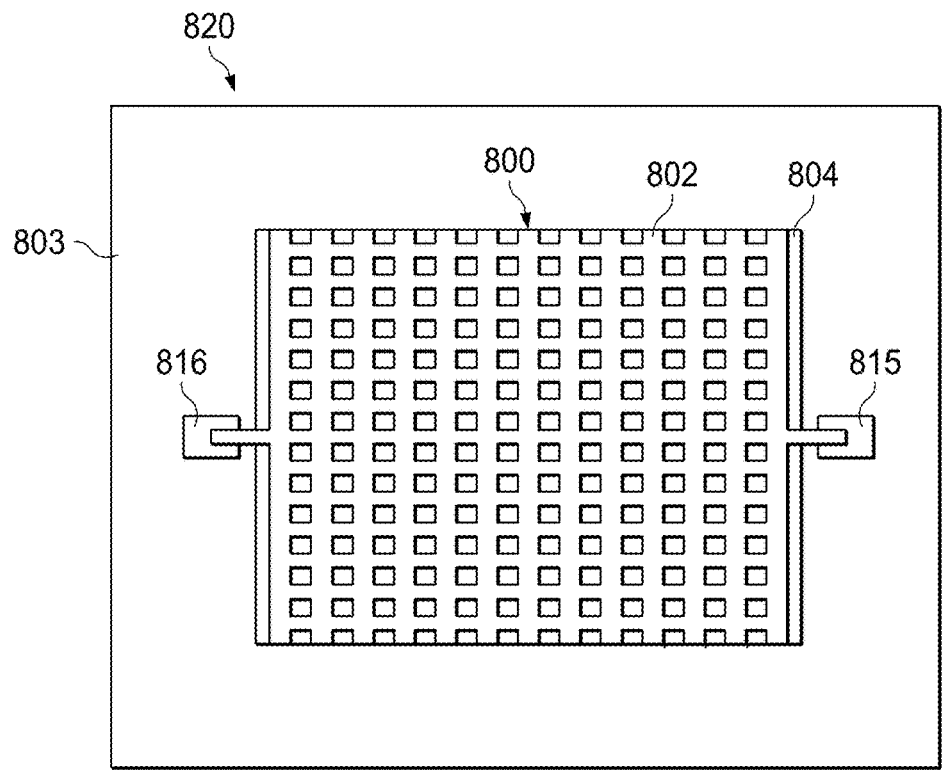
FIGS. 8-10 illustrate alternative embodiments of a porous electrode.

FIG. 8 illustrates an alternative embodiment of a porous electrode 802 for a parallel plate capacitive sensor 800. In this example, porous electrode 802 with one or more contacts 815, 816 for coupling to other circuitry on IC 820 may be formed on top of sensing layer 804 and substrate 803 as described above in more detail above. The grid structure may be formed by control of an inkjet printing process with nanoparticles used to form the electrode, for example.

Once the electrode 802 structure is printed, a sintering process, or other fusing process that is appropriate to the chosen ink, may be used to fuse the nanoparticles, as described above in more detail.

In this manner, a top electrode may be formed that has an array of openings to form a porous electrode and in which the electrode material is a fusion of metallic nanoparticles having a random three dimensional porosity that is permeable to a reagent. This configuration may allow a larger volume of reagent to interact with the sensing membrane.

Figure 9:
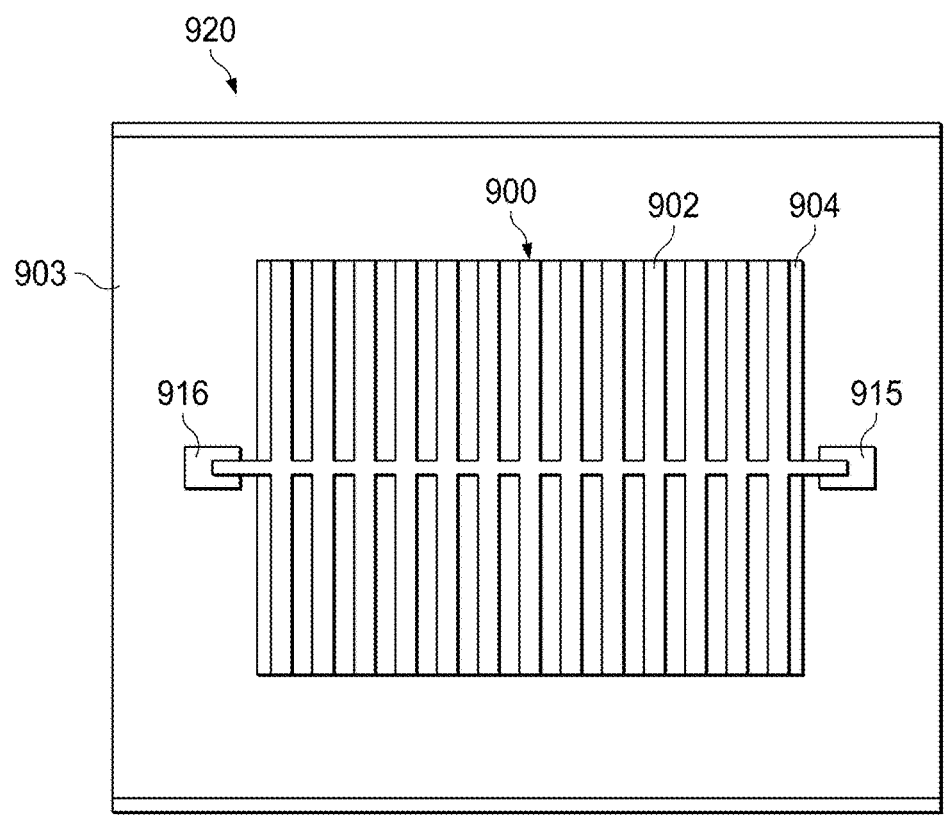

FIG. 9 illustrates alternative embodiment of a porous electrode 902 for a parallel plate capacitive sensor 900. In this example, porous electrode 902 with one or more contacts 915, 916 for coupling to other circuitry on IC 920 may be formed on top of sensing layer 904 and substrate 903 as described above in more detail above. The grid structure may be formed by control of an inkjet printing process with nanoparticles used to form the electrode, for example.

Once the electrode 902 structure is printed, a sintering process, or other fusing process that is appropriate to the chosen ink, may be used to fuse the nanoparticles, as described above in more detail.

In this manner, a top electrode may be formed that has an array of openings to form a porous electrode and in which the electrode material is a fusion of metallic nanoparticles having a random three dimensional porosity that is permeable to a reagent. This configuration may allow a larger volume of reagent to interact with the sensing membrane.

Figure 10:
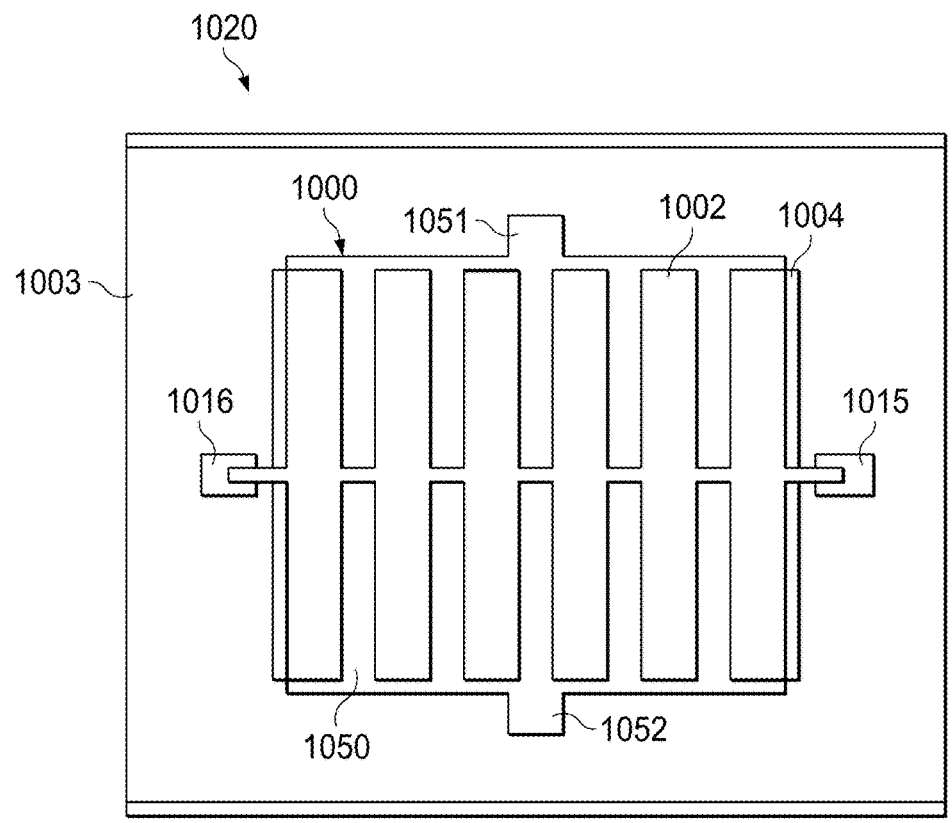

FIG. 10 is a top view of an alternative embodiment of a capacitive sensor 1000 that is part of an IC 1020. In this example, porous electrode 1002 with one or more contacts 1015, 1016 for coupling to other circuitry on IC 1020 may be formed on top of sensing layer 1004 and substrate 1003 as described above in more detail above. Once the nanoparticle electrode 1002 structure is printed, a sintering process, or other fusing process that is appropriate to the chosen ink, may be used to fuse the nanoparticles, as described above in more detail.

In this example, a portion of the top electrode indicated at 1050 is configured to have a resistive region such that when a current is passed through the resistive region from contact 1051 to contact 1052, for example, the resistive region is heated. In this manner, sensing membrane 1004 may be heated to cause embedded reagent to be expunged from the sensing membrane.

The alternating regions of conductivity and resistivity may be formed by control of an inkjet printing process with different combinations of nanoparticles used to form the electrode regions, for example.

While an alternating arrangement of conductive electrode regions 1002 and resistive regions 1050 is illustrated here, in another example the resistive region may be formed as a second permeable layer either above or below the conductive electrode region, for example.

Figure 11:
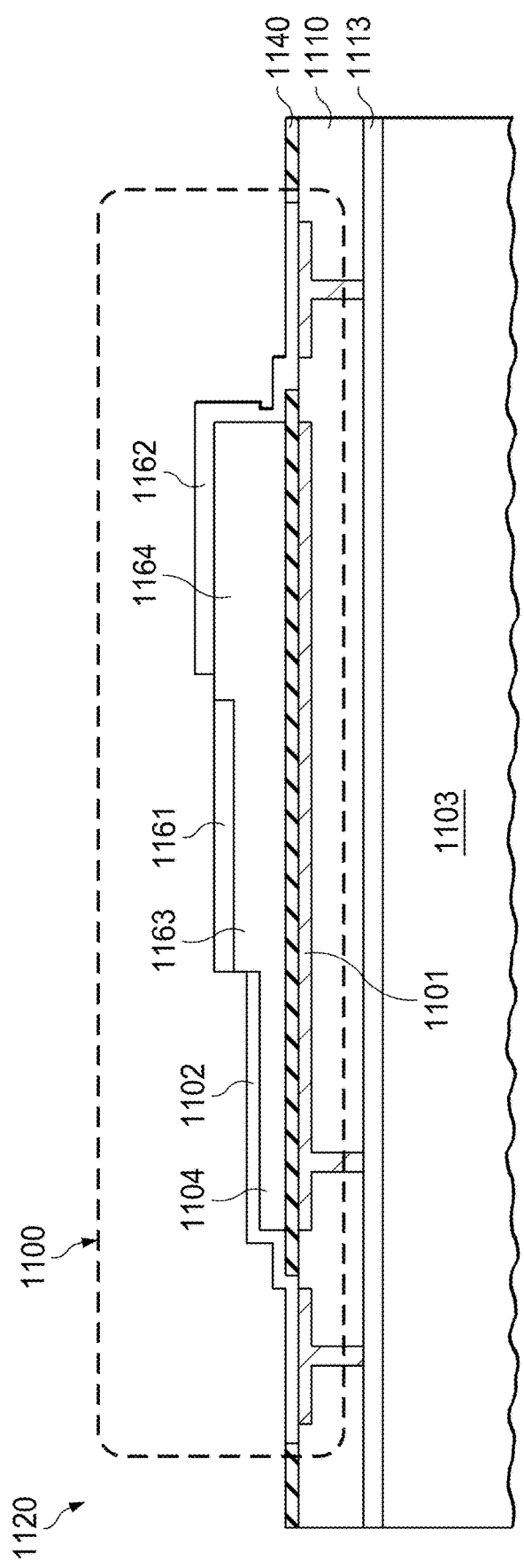
FIG. 11 is a cross sectional view of an alternative embodiment of a capacitive sensor.

FIG. 11 is a cross sectional view of an alternative embodiment of a capacitive sensor 1100 that may be provided on an example IC 1120. As described above in more detail, a bottom conductive plate 1101 may be patterned into a metal layer of a multilayer interconnect that overlies a substrate 1103. Active circuitry may be formed in an epi layer 1113 and connected to the conductive plate 1101 using vias through insulating layer(s) 1110.

A gradated sensing layer 1104 may be formed on the botton electrode 1101. In this example, steps 1163, 1164 may be formed by control of an inkjet process, for example. In another example, additional gradation steps may be implemented, for example. In some embodiments, the gradation may be an approximately smooth ramp, for example.

Separate upper electrodes 1102, 1161, 1162 may be formed over the gradated sensing membrane and connected to active circuitry in the epi layer 1113 using multiple vias. In another embodiment, the upper electrode may be contiguous. Gradated sensing membrane 1104 may provide additional sensing information about a reagent. For example, detection of a rate of diffusion into the thicker areas 1162, 1164 may be performed.

Figure 12:
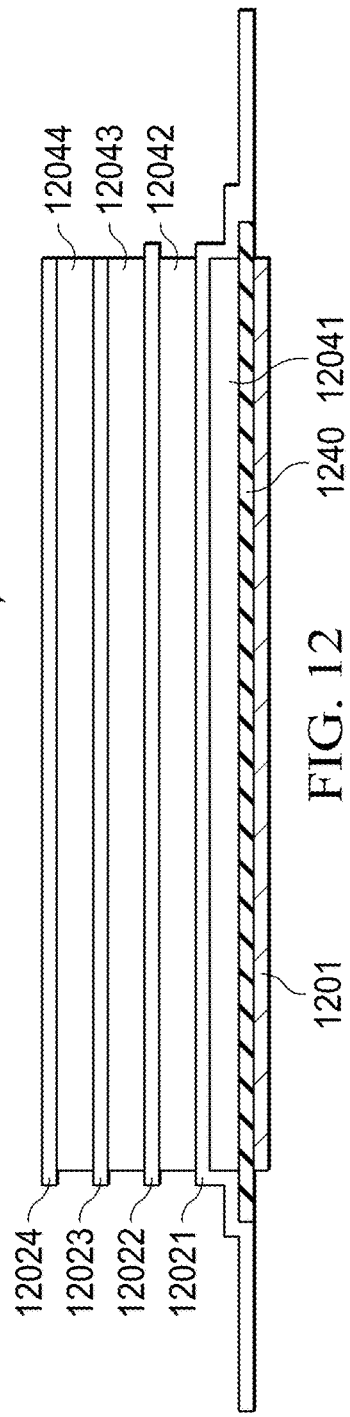
FIG. 12 is a cross sectional view of an alternative embodiment of a capacitive sensor with multiple porous electrodes.

FIG. 12 is a cross sectional view of an alternative embodiment of a capacitive sensor 1200 with multiple porous electrodes printed throughout the sensor membrane. This configuration may allow measurement of diffusion time of a reagent into the sensing membrane, for example.

In this example, four porous electrodes 12021-12024 are illustrated. Other embodiments may have more or fewer electrodes. This configuration may be fabricated by printing alternate layers of sensing material 12041-12044 and porous electrode material 12021-12024, for example. Bottom electrode 1201 and optional nitride layer 1240 may be formed on a substrate as described above in more detail.

System Example

Figure 13:
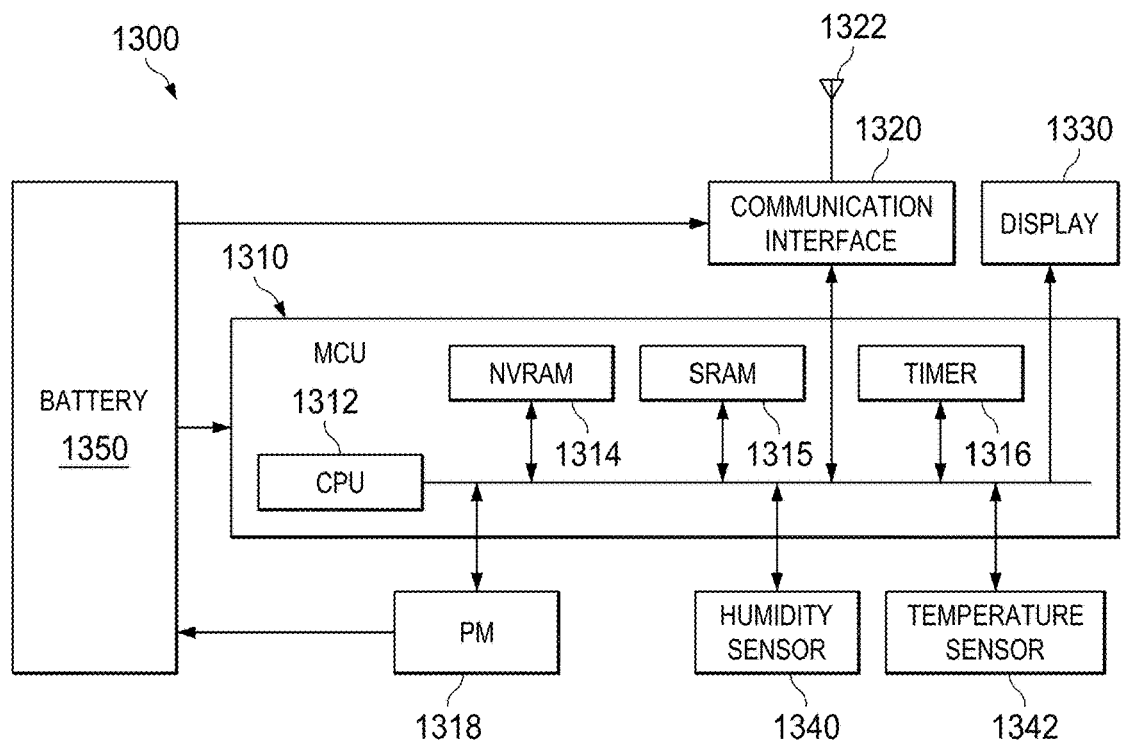
FIG. 13 is a block diagram of a system that includes a capacitive sensor.

FIG. 13 is a block diagram of an example wireless sensor 1300 for use in a network that may include multiple wireless and/or wired sensors. This example includes a humidity sensor 1340 for sensing ambient humidity that may be fabricated as described above in more detail. As described above, various embodiments may include various implementations of parallel plate capacitive sensors that have a random three dimensional porosity that is permeable to a reagent.

Sensor node 1300 may include a microcontroller (MCU) 1310 coupled to a communications interface 1320. MCU 1310 may include a non-volatile random access memory NVRAM storage module 1314, a static random access memory 1315, one or more timer modules 1316, and other various interfaces for coupling to communications interface 1320, display 1330, and sensors 1340, 1342.

MCU 1310 may be embodied as an MSP430FR57xx available from Texas Instruments, for example. The Texas Instruments MSP430FR57xx family of ultralow-power microcontrollers includes multiple devices featuring embedded ferroelectric nonvolatile memory FRAM), ultralow power 16-bit MSP430 CPU, and different peripherals targeted for various applications.

Communications interface 1320 may include a transmitter and a receiver for wireless communication with an external controller. Interface 1320 may communicate using RF standards such as ZigBee, which is popular in low data rate, low power applications. ZigBee and other low power RF standards use MAC and PHY layers defined by IEEE 802.15.4.

Display 1330 may be a simple set of LEDs (light emitting diodes), or a more complex LCD (liquid crystal display), for example. In some embodiments, display 1330 may be omitted.

Other sensors may also be included, such a temperature sensor 1342 for sensing air temperature. However, various embodiments may include a wide range of known or later developed sensors that may be used to collect various types of environmental data.

Battery 1350 provides power to MCU 1310, communication interface 1320, display 1330 and sensors 1340, 1342. Power management (PM) logic 1318 may be included within MCU 1310, or it may be separate. PM logic 1318 may be configured to control power levels provided to MCU 1310, communications interface 1320, display 1330, and sensors 1340, 1342.

There are various techniques that may be used to determine the capacitance of the sense capacitor in response to exposure to a reagent. For example, the charge storage capability may be measured by charging with a voltage source and discharging to a known capacitor. A data converter may then be used to digitize the reading. This may be done under control of controller 1312, for example.

Another technique to measure capacitance is to connect the capacitor to an oscillator and measure a resultant frequency to extrapolate capacitance. Another technique is to charge the sense capacitor to a known voltage and then discharge it at a fixed rate to measure discharge time.

Other Embodiments

While the invention has been described with reference to illustrative embodiments, this description is not intended to be construed in a limiting sense. Various other embodiments of the invention will be apparent to persons skilled in the art upon reference to this description. For example, two interdigitated electrodes may be formed on the substrate, with an intermediate conductive plate on the top surface of the sensing membrane, such that the top conductive plate is a fusion of metallic nanoparticles having a random three dimensional porosity that is permeable to a reagent.

While a single sensing capacitor on an IC was discussed herein, various embodiments may include multiple sensing capacitors within a single IC that each may be tailored to measure a different reagent by based on the type of sensing membrane used for each sensing capacitor and the presence or absence of various filter membranes and/or conductive plate porosity.

While capacitive sensors are described in detail herein, other embodiments may include impedance sensors in which the resistance of the sensing membrane varies in response to the reagent, for example.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. An integrated circuit (IC) comprising:
   a substrate; and
   an impedance sensor fabricated on a surface of the substrate, in which the impedance sensor includes:
      a bottom conductive plate formed on the substrate;
      a gradated sensing membrane formed on the bottom conductive plate;
      a first porous top conductive plate formed on first portion of the gradated sensing membrane, in which the first porous top conductive plate is a fusion of electrically conductive nanoparticles having a random three-dimensional porosity permeable to a reagent; and
      a second porous top conductive plate formed on a second portion of the gradated sensing membrane, in which a thickness of the first portion of the gradated sensing membrane between the first porous top conductive plate and the bottom conductive plate measured on an axis perpendicular to a surface of the substrate is different from a thickness of the second portion of the gradated sensing membrane between the second porous top conductive plate and the bottom conductive plate measured on an axis perpendicular to the surface of the substrate.

2. The IC of claim 1, further comprising one or more permeable filter layers formed between the sensing membrane and the first and second porous top conductive plates, in which the one or more permeable layers extend entirely across the first and second porous top conductive plates.

3. The IC of claim 1, further comprising first and second permeable filter layers formed on the first and second porous top conductive plates, the first permeable filter layer having a first permeability, and the second permeable filter layer having a second permeability that is different from the first permeability.

4. The IC of claim 1, wherein the gradated sensing membrane has a porosity formed by removal of sacrificial nanoparticles.

5. The IC of claim 1, wherein the gradated sensing membrane has a thickness between the bottom conductive plate and the first porous top conductive plate and the second porous top conductive plate that is gradated across the bottom conductive plate.

6. The IC of claim 1, wherein the first porous top conductive plate has defined regions of different conductivity and resistivity.

7. The IC of claim 1, further comprising a plurality of porous intermediate electrodes spaced throughout the gradated sensing membrane.

8. The IC of claim 1, further comprising a microcontroller coupled to the impedance sensor, the microcontroller configured to determine an impedance of the impedance sensor responsive to exposure to a reagent.

9. An integrated circuit (IC) comprising:
   a substrate;
   an impedance sensor fabricated on a surface of the substrate, in which the impedance sensor includes:
      a bottom conductive plate formed on the substrate;
      a sensing membrane formed on the bottom conductive plate, a first portion of the sensing membrane having a first thickness measured on an axis perpendicular to a surface of the substrate, and a second portion of the sensing membrane having a second thickness measured on an axis perpendicular to the surface of the substrate different from the first thickness;
      a first porous top conductive plate formed on the first portion of the sensing membrane; and
      a second porous top conductive plate formed on the second portion of the sensing membrane; and
   a microcontroller coupled to the impedance sensor, the microcontroller configured to determine an impedance of the impedance sensor responsive to exposure to a reagent.

10. The IC of claim 9, wherein the sensing membrane has a porosity formed by removal of sacrificial nanoparticles.

11. The IC of claim 10, wherein the first and second porous top conductive plates have a porosity formed by a size of the conductive nanoparticles.

12. The IC of claim 9, wherein the sensing membrane has a thickness between the bottom conductive plate and the first and second porous top conductive plates that is gradated across the bottom conductive plate.

13. The IC of claim 9, further comprising first and second permeable filter layers formed on the first and second porous top conductive plates, the first permeable filter layer having a first permeability, and the second permeable filter layer having a second permeability that is different from the first permeability.

14. The IC of claim 9, further comprising one or more permeable filter layers formed between the sensing membrane and the first porous top conductive plate and the second porous top conductive plate, in which the one or more permeable filter layers extend entirely across the first porous top conductive plate and the second porous top conductive plate.

15. The IC of claim 9, wherein the first porous top conductive plate and has defined regions of different conductivity and resistivity.

* * * * *